United States Patent [19]

Kammerl et al.

[11] Patent Number: 5,115,148
[45] Date of Patent: May 19, 1992

[54] INTERFACE BETWEEN TWO ELECTRICAL CIRCUITS OPERATED AT DIFFERENT OPERATING VOLTAGES

[75] Inventors: August Kammerl, Brunn; Ernst Niedermeier, Hohengebraching, both of

[73] Assignee: Siemens Aktiengesellschaft, Munich, Fed. Rep. of Germany

[21] Appl. No.: 600,668

[22] Filed: Oct. 22, 1990

[30] Foreign Application Priority Data

Nov. 2, 1989 [DE] Fed. Rep. of Germany ... 8912984[U]

[51] Int. Cl.⁵ ................ H03K 19/0175; H03K 5/153
[52] U.S. Cl. .................................... 307/475; 307/362; 307/253; 307/558
[58] Field of Search ............... 307/454, 253, 362, 363, 307/475, 558, 567

[56] References Cited

U.S. PATENT DOCUMENTS

| | | | |
|---|---|---|---|
| 3,809,930 | 5/1984 | Brown et al. | 307/253 |
| 3,931,581 | 1/1976 | Kush, Jr. et al. | 307/253 |
| 4,613,768 | 9/1986 | Pommer, II | 307/363 |
| 4,689,501 | 8/1987 | Schoofs et al. | 307/362 |
| 4,749,884 | 6/1988 | Karban et al. | 307/475 |

*Primary Examiner*—David Hudspeth
*Assistant Examiner*—Andrew Sanders
*Attorney, Agent, or Firm*—Hill, Van Santen, Steadman & Simpson

[57] ABSTRACT

Interface between two electrical circuits operated from different operating voltages, whereby an input level of the receiving circuit is proportional to the fluctuating operating voltage of the transmitting circuit. An output signal of the transmitting circuit is compared to the input level in a means for comparing that is formed with a transistor. Depending on the connection of the output signal and the input level to the transistor, an inverting or non-inverting interface circuit can be structured with few, economical component parts having small space requirements.

11 Claims, 1 Drawing Sheet

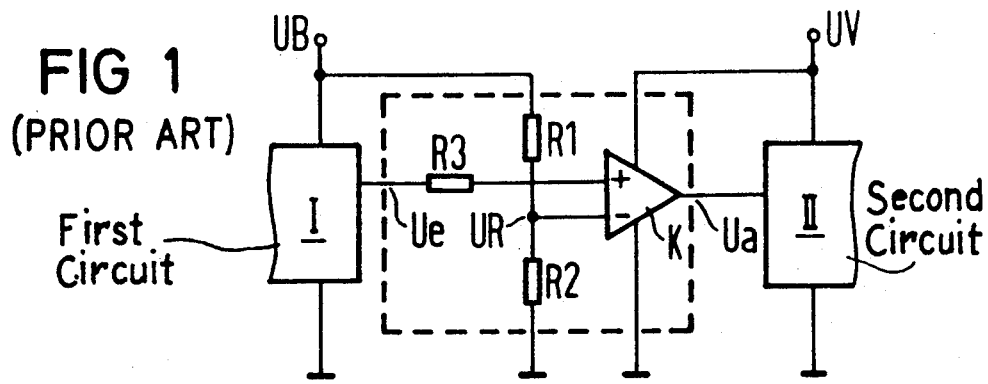
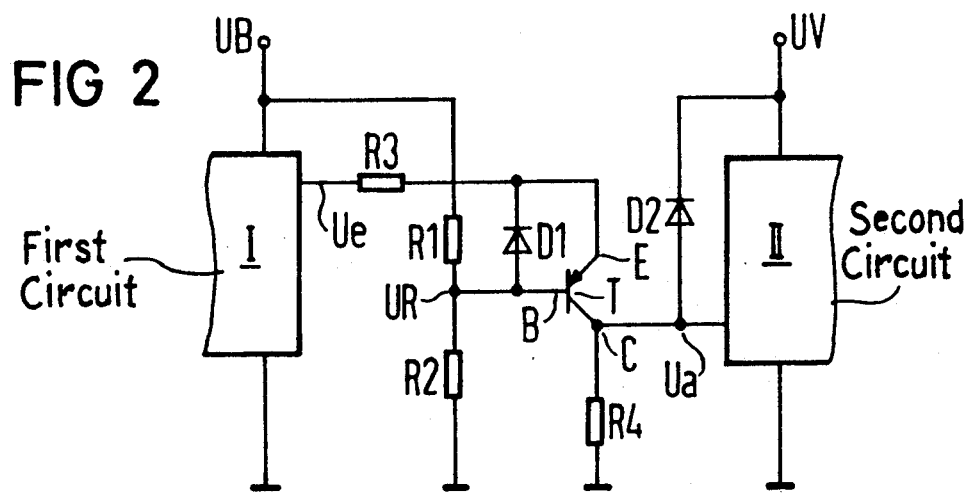
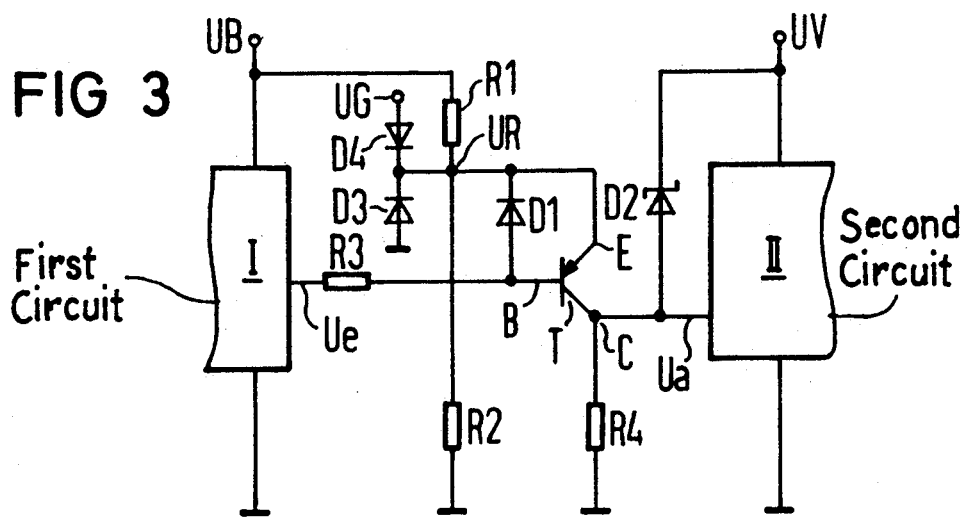

INTERFACE BETWEEN TWO ELECTRICAL CIRCUITS OPERATED AT DIFFERENT OPERATING VOLTAGES

BACKGROUND OF THE INVENTION

The present invention is directed to an interface between two electrical circuits operated at different operating voltages. An input signal of the interface corresponds to an output signal of the first circuit, the input signal being compared in a comparator to a reference voltage which is proportional to a first operating voltage. An output signal of the comparator corresponding to an input signal of the second circuit.

Such interfaces are required when circuits having different operating voltages or different signal levels are to interface with one another, for example, circuits used in motor vehicles. In motor vehicles signals are generated in circuits operating from a battery voltage UB of the onboard network, the output signals are processed in further circuits that operate from a different supply voltage UV. A disadvantage of this system is that the battery voltage UB and, thus, the output level of the circuit operated therefrom fluctuates greatly and can have considerable noise signals.

In the worst case, an improved signal-to-noise characteristic can be achieved when the input level of the receiving circuit is kept proportional to the operating voltage of the transmitting circuit. This is usually achieved by a reference voltage UR for an integrated comparator of the receiving circuit being derived from a voltage divider from the operating voltage of the transmitting circuit, i.e. from the battery voltage for a motor vehicle. The output signal of the transmitting circuit is compared to this reference voltage UR. The output signal of the comparator that is at the supply voltage of the receiving circuit is independent of the magnitude of its input signals. The drawback of this solution is that an integrated circuit is used that is extremely expensive and that requires a great deal of space.

SUMMARY OF THE INVENTION

It is an object of the present invention to provide a circuit of the type initially cited that does not require an integrated comparator and that has a low space requirement and low material costs.

This object is inventively achieved by a transistor being the comparator. The transistor has a collector as the first terminal at which the output signal can be taken and which is connected via a resistor to the negative pole of the first operating voltage. The transistor also has a second terminal for receiving the reference voltage and a third terminal for receiving the input signal.

The present invention provides a considerable circuit-oriented simplification without a deterioration of precision and edge steepness of the output signal from the integrated comparator.

By simply interchanging two transistor terminals, the circuit can be optionally operated as an inverting interface or as a non-inverting interface. On the basis of simple, additional measures for limiting the reference voltage and the output signal, it is possible to operate the transmitting circuit with a highly fluctuating battery voltage, even when this occurs outside of the normally allowable voltage range.

BRIEF DESCRIPTION OF THE DRAWINGS

The features of the present invention which are believed to be novel, are set forth with particularity in the appended claims. The invention, together with further objects and advantages, may best be understood by reference to the following description in conjunction with the accompanying drawings, in the several FIGS. in which like reference numerals identify like elements, and in which:

FIG. 1 is a diagram of a prior art circuit having an integrated comparator;

FIG. 2 is a diagram of a non-inverting circuit of the present invention; and

FIG. 3 is a diagram of a circuit of an inverting interface of the present invention.

DESCRIPTION OF THE PREFERRED EMBODIMENT

FIG. 1 shows the afore-mentioned prior art circuit of an interface having an integrated comparator K. The interface bounded with broken lines receives its input signals Ue (only one being shown) from a transmitting circuit I that is operated at the battery voltage UB of an on-board motor vehicle network. This input signal Ue is converted in the interface to an output signal Ua that is matched to the input level of a receiving circuit II, that is operated at a supply voltage UV, for example +5 volts. The comparator K compares the input signal Ue, supplied to a non-inverting input thereof via a protective resistor R3, to a reference voltage UR that is derived from the battery voltage UB via a voltage divider composed of two resistors R1 and R2 and which is connected at its inverting input. When the input voltage Ue exceeds the reference voltage UR, then the output signal Ua of the comparator K is a high level signal whose voltage value roughly corresponds to the supply voltage UV. Otherwise, it is a low level signal of approximately 0 volts. Such an interface requires a relatively large amount of space and high components costs.

Given the interface circuits of the present invention according to FIGS. 2 and 3, the integrated comparator K of FIG. 1 is replaced by a transistor T that is connected to a diode D1 and a resistor R4. FIG. 2 depicts the circuit of a non-inverting interface that corresponds to the circuit of FIG. 1 in terms of function. All components and voltages or signals, with the exception of the transistor T, the diode D1 and the resistor R4, correspond to the same elements of FIG. 1.

The transistor T is a pnp transistor having a base B to which the reference voltage UR is applied. The input signal Ue is applied to the emitter E of the transistor T via a protective resistor R3. A diode D1, connected in conducting direction relative to the emitter E, is connected across the base B and the emitter E. The output signal Ua can be taken at the collector C of the transistor T that is connected to the negative pole of the battery voltage UB via a resistor R4. A diode D2 is connected from the collector C to the positive pole of the supply voltage UV. As a result, the output signal Ua is limited to approximately the value UV.

When the input signal Ue exceeds the reference voltage UR by the value of the base-emitter voltage of the transistor T, then the transistor T becomes conductive and the output signal Ua appearing as a voltage drop via the resistor R4 can be taken at the collector C. Otherwise, the transistor T is non-conductive and its collector C is at the potential of the negative pole of the battery voltage UB.

FIG. 3 shows the circuit of the present invention as an inverting interface. It essentially corresponds to the circuit of FIG. 2 with the difference that the terminals for reference voltage UR and input signal Ue at the transistor T are interchanged with one another. That is, the reference voltage UR is connected to the emitter E and the input signal Ue is connected to the base B of the transistor T via the protective resistor R3. As a result, the output Ua is a high level signal when the input signal Ue is lower than the reference voltage UR reduced by the base-emitter voltage of the transistor T. When, by contrast, the input signal exceeds this value, the output signal Ua is a low level signal because the transistor T is then non-conductive and its collector C is at a negative potential.

As a FIG. 2, the collector C of the FIG. 3 circuit is also connected via a diode D2 to the positive pole of the supply voltage UV of the receiving circuit II. This diode is shown here as a Schottky diode. As in the exemplary embodiment of FIG. 2, this diode also serves the purpose of limiting the output signal Ua.

Also shown in FIG. 3 is an additional series circuit of two diodes D3 and D4 that are connected between a variable limit voltage UG and the negative pole of the battery voltage UB, whereby the junction of the two diodes is connected to the tap of the voltage divider R1, R2. As a result of this auxiliary circuit, the reference voltage UR is limited to values between a minimum value and a maximum value. This can also be used in the non-inverting circuit of FIG. 2. The diode D3 can be a Zener diode in both instances. It thereby becomes possible in a simple manner to also operate the interface of the present invention at a battery voltage UB that, at least occasionally, exceeds the allowable voltage range.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. Interface between first and second electrical circuits operated from a highly fluctuating first voltage and a second operating voltage, respectively, comprising:
    said interface receiving an input signal corresponding to an output first circuit signal of the first circuit, said input signal being compared in a means for comparing to a reference voltage which is proportional to the first operating voltage, an output signal of the means for comparing corresponding to an input second circuit signal of the second circuit;
    a transistor being the means for comparing;
    a first terminal being the collector of the transistor from which the output signal is taken and which is connected via a resistor to a negative pole of the first operating voltage;
    a second terminal of the transistor receiving the reference voltage; and
    a third terminal of the transistor receiving the input signal.

2. Interface according to claim 1, wherein for non-inverting operation, the second terminal of the transistor is a base thereof and the third terminal of the transistor is an emitter thereof.

3. Interface according to claim 1, wherein for inverting operation, the second terminal of the transistor is an emitter thereof and the third terminal of the transistor is a base thereof.

4. Interface between first and second electrical circuits operated from different first and second operating voltages, respectively, said interface receiving an input signal corresponding to an output first circuit signal of the first circuit, said input signal being compared in a means for comparing to a reference voltage which is proportional to the first operating voltage, an output signal of the means for comparing corresponding to an input second circuit signal of the second circuit, comprising:
    a transistor being the means for comparing;
    a first terminal being the collector of the transistor from which the output signal is taken and which is connected via a resistor to a negative pole of the first operating voltage;
    a second terminal of the transistor receiving the reference voltage;
    a third terminal of the transistor receiving the input signal; and
    a diode connected from the collector of the transistor to a terminal of the second voltage having a prescribed voltage value.

5. Interface between first and second electrical circuits operated from different first and second operating voltages, respectively, said interface receiving an input signal corresponding to an output first circuit signal of the first circuit, said input signal being compared in a means for comparing to a reference voltage which is proportional to the first operating voltage, an output signal of the means for comparing corresponding to an input second circuit signal of the second circuit, comprising:
    a transistor being the means for comparing;
    a first terminal being the collector of the transistor from which the output signal is taken and which is connected via a resistor to a negative pole of the first operating voltage;
    a second terminal of the transistor receiving the reference voltage;
    a third terminal of the transistor receiving the input signal; and
    a diode connected from a first terminal point having the reference voltage to the negative pole of the first voltage and wherein a further diode is connected from the first terminal point to a second terminal point having a variable limit voltage.

6. Interface between first and second electrical circuits operated from different first and second operating voltages, respectively, said interface receiving an input signal corresponding to an output first circuit signal of the first circuit, said input signal being compared in a means for comparing to a reference voltage which is proportional to the first operating voltage, an output signal of the means for comparing corresponding to an input second circuit signal of the second circuit, comprising: for inverting operation,
    a transistor being the means for comparing;
    a first terminal of the transistor being its collector at which the output signal can be taken and which is connected via a resistor to a negative pole of the first operating voltage;

a second terminal of the transistor being its emitter which receives the reference voltage;

a third terminal of the transistor being its base which receives the input signal; and a diode connected from the collector to the second operating voltage.

7. Interface between first and second electrical circuits operated from different first and second operating voltages, respectively, said interface receiving an input signal corresponding to an output first circuit signal of the first circuit, said input signal being compared in a means for comparing to a reference voltage which is proportional to the first operating voltage, an output signal of the means for comparing corresponding to an input second circuit signal of the second circuit, comprising: for non-inverting operation, a transistor being the means for comparing;

a first terminal of the transistor being its collector at which the output signal can be taken and which is connected via a resistor to a negative pole of the first operating voltage;

a second terminal of the transistor being its base which receives the reference voltage;

a third terminal of the transistor being its emitter which receives the input signal; and a diode connected from the collector to the second operating voltage.

8. Interface according to claim 4, wherein for non-inverting operation, the second terminal of the transistor is a base thereof and the third terminal of the transistor is an emitter thereof.

9. Interface according to claim 4, wherein for inverting operation, the second terminal of the transistor is an emitter thereof and the third terminal of the transistor is a base thereof.

10. Interface according to claim 5, wherein for non-inverting operation, the second terminal of the transistor is a base thereof and the third terminal of the transistor is an emitter thereof.

11. Interface according to claim 5, wherein for inverting operation, the second terminal of the transistor is an emitter thereof and the third terminal of the transistor is a base thereof.

* * * * *